(12) United States Patent
Yuzurihara et al.

(10) Patent No.: US 7,994,552 B2
(45) Date of Patent: Aug. 9, 2011

(54) PHOTOELECTRIC CONVERSION DEVICE, METHOD FOR MANUFACTURING THE SAME AND IMAGE PICKUP SYSTEM

(75) Inventors: Hiroshi Yuzurihara, Atsugi (JP); Seiichi Tamura, Yokohama (JP); Ryuichi Mishima, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 12/041,738

(22) Filed: Mar. 4, 2008

(65) Prior Publication Data
US 2008/0157153 A1 Jul. 3, 2008

Related U.S. Application Data

(62) Division of application No. 11/214,846, filed on Aug. 31, 2005, now Pat. No. 7,365,380.

(30) Foreign Application Priority Data

Sep. 1, 2004 (JP) ................................. 2004-254359

(51) Int. Cl.
*H01L 27/146* (2006.01)

(52) U.S. Cl. ........ 257/292; 257/234; 257/239; 257/241; 257/243; 257/290; 257/291; 257/293; 257/294; 257/E27.134; 257/E27.135

(58) Field of Classification Search .................. 257/292, 257/E27.133, 234, 239, 241, 243, 290, 291, 257/293, 294, E27.134, E27.135
See application file for complete search history.

(56) References Cited

U.S. PATENT DOCUMENTS

| | | | | |
|---|---|---|---|---|
| 5,514,887 A * | 5/1996 | Hokari | ........................... | 257/222 |
| 5,552,854 A | 9/1996 | Nishimura | ....................... | 396/51 |
| 5,751,348 A | 5/1998 | Inuiya et al. | ................ | 348/220.1 |
| 6,023,081 A * | 2/2000 | Drowley et al. | ............... | 257/292 |
| 6,051,857 A | 4/2000 | Miida | ............... | 257/292 |
| 6,281,531 B1 * | 8/2001 | Kamashita et al. | ............ | 257/258 |
| 6,423,993 B1 | 7/2002 | Suzuki et al. | .................. | 257/292 |
| 6,504,193 B1 | 1/2003 | Ishiwata et al. | ................ | 257/291 |

(Continued)

FOREIGN PATENT DOCUMENTS

JP 2000-165755 A 6/2000

(Continued)

OTHER PUBLICATIONS

B. C. Burkey et al., The Pinned Photodiode for an Interline-Transfer CCD Image Sensor, IEDM, 1984, pp. 28-31.*

(Continued)

*Primary Examiner* — Eugene Lee
*Assistant Examiner* — Peniel M Gumedzoe
(74) *Attorney, Agent, or Firm* — Fitzpatrick, Cella, Harper & Scinto

(57) ABSTRACT

An object of the present invention is to provide a photoelectric conversion device, wherein improvement of charge transfer properties when charge is output from a charge storage region and suppression of dark current generation during charge storage are compatible with each other. This object is achieved by forming a depletion voltage of a charge storage region in the range from zero to one half of a power source voltage (V), forming a gate voltage of a transfer MOS transistor during a charge transfer period in the range from one half of the power source voltage to the power source voltage (V) and forming a gate voltage of the transfer MOS transistor during a charge storage period in the range from minus one half of the power source voltage to zero (V).

4 Claims, 6 Drawing Sheets

U.S. PATENT DOCUMENTS

| | | | |
|---|---|---|---|
| 6,504,194 B1 * | 1/2003 | Miida | 257/292 |
| 6,661,459 B1 | 12/2003 | Koizumi et al. | 348/310 |
| 6,850,278 B1 | 2/2005 | Sakurai et al. | 348/302 |
| 7,126,102 B2 | 10/2006 | Inoue et al. | 250/214 |
| 7,323,731 B2 * | 1/2008 | Yuzurihara et al. | 257/292 |
| 7,365,380 B2 * | 4/2008 | Yuzurihara et al. | 257/292 |
| 2001/0042875 A1 | 11/2001 | Yoshida | 257/291 |
| 2002/0047174 A1 | 4/2002 | De Pauw et al. | 257/431 |
| 2002/0063302 A1 | 5/2002 | Furumiya et al. | 257/432 |
| 2005/0127415 A1 | 6/2005 | Yuzurihara et al. | 257/292 |
| 2006/0172450 A1 | 8/2006 | Tazoe et al. | 438/57 |
| 2006/0208160 A1 | 9/2006 | Mishima et al. | 250/208.1 |

FOREIGN PATENT DOCUMENTS

| | | |
|---|---|---|
| JP | 2001-196572 | 7/2001 |
| JP | 2004-39671 | 2/2004 |

OTHER PUBLICATIONS

S. Wolf, Silicon Processing for the VLSI Era, 1995, Lattice Press, vol. 1, p. 323, and vol. 2, pp. 232-239.

* cited by examiner

PHOTOELECTRIC CONVERSION DEVICE, METHOD FOR MANUFACTURING THE SAME AND IMAGE PICKUP SYSTEM

CROSS REFERENCE TO RELATED APPLICATION

This application is a division of U.S. application Ser. No. 11/214,846, filed Aug. 31, 2005, the entire disclosure of which is hereby incorporated by reference herein.

BACKGROUND OF THE INVENTION

1. Field of the Invention

The present invention relates to a photoelectric conversion device, a method for manufacturing the same and an image pickup system, and in particular, to a CMOS area sensor and a method for manufacturing the same, as well as a photoelectric conversion device which can be suitably used in the manufacturing method thereof, a method for manufacturing the same and an image pickup system.

2. Related Art

A CCD has been known as a solid state image pickup element for converting image signals to electrical signals. This CCD has photodiode arrays, which are adapted to read out charge stored in each photodiode as electrical signals by applying pulse voltages to the same.

Moreover, a CMOS area sensor into which peripheral circuits are integrally formed together by a CMOS process has been used in recent years.

A CMOS area sensor has advantages such as low power consumption and low drive power compared with a CCD, and so future expansion of demand for CMOS area sensors is expected.

A CMOS area sensor will be described below with reference to FIG. 8 as a representative example of a photoelectric conversion device.

FIG. 8 shows a schematic cross-sectional view of a photodiode unit 301 and a transfer MOS transistor unit 302 of a CMOS area sensor.

Reference numeral 303 denotes an N-type silicon substrate; reference numeral 304 denotes a P-type well; reference numeral 307 denotes a gate electrode of the transfer MOS transistor; reference numeral 308 denotes an N-type charge storage region of the photodiode; and reference numeral 309 denotes a surface P-type region for providing the photodiode with a buried structure. In addition, reference numeral 305 denotes a field oxide film for element isolation; and reference numeral 310 denotes an N-type high concentration region which forms floating diffusion and functions as a drain region of the transfer MOS transistor 302.

Reference numeral 311 denotes a silicon oxide film to insulate the gate electrode and a first wiring layer; reference numeral 312 denotes a contact plug; reference numeral 313 denotes a first wiring layer; reference numeral 314 denotes an interlayer insulating film to insulate the first wiring layer from a second wiring layer; reference numeral 315 denotes a second wiring layer; reference numeral 316 denotes an interlayer insulating film to insulate the second wiring layer from a third wiring layer; reference numeral 317 denotes a third wiring layer; and reference numeral 318 denotes a passivation film.

A color filter layer (not shown) and a micro-lens for increasing sensitivity are formed over the passivation film 318.

Light incident on the surface then enters the photodiode through an opening bordered by the third wiring layer 317.

The light is absorbed in the N-type charge storage region 308 or the P-type well 304 of the photodiode to form an electron-hole pair, from which electrons are stored in the N-type charge storage region 308.

The transfer MOS transistor unit of the CMOS area sensor is preferably designed so that it can efficiently, preferably completely, transfer electrons stored in the photodiode to the floating diffusion unit.

If a pixel with low transfer efficiency is present, the output of the corresponding pixel is smaller than that of normal pixels, so that a black output image is produced, which is a defect called "a black flaw".

Further, the output may sometimes vary whenever a photograph is taken, causing deterioration of images as a random noise.

Furthermore, the transfer MOS transistor is connected to the photodiode, and when dark current is produced and electrons flow into the photodiode while the transfer MOS transistor is turned off, the output of corresponding images is larger than that of normal images. This may produce a white output image, which is a defect called "a white flaw".

In order to prevent the above-described problems, prior art for the transfer MOS structure has proposed a structure in which work function of a gate electrode is controlled as described in Japanese Patent Application Laid-Open No. 2001-196572, or in which a gate electrode is additionally provided as described in Japanese Patent Application Laid-Open No. 2004-039671.

However, it has been desired that transfer efficiency of electrons in the photodiode is improved, or that preferably the electrons are completely transferred, in conventional photoelectric conversion devices, in particular in the transfer MOS transistor structure of the CMOS area sensor. In order to achieve the desire, a structure is proposed in which the signal charge storage region is extended under the transfer gate (U.S. Pat. No. 6,504,193). Further, a structure is proposed in which an n-type diffusion region (when the transfer MOS transistor is an n-MOS) is provided between a photodiode and a drain of the transfer MOS transistor (U.S. Pat. No. 6,661,459), wherein the concentration of impurities in the diffusion region had to be increased.

Moreover, for transferring charge, high voltage on the plus side had to be applied to the gate electrode of the transfer MOS transistor (in the case where the transfer MOS transistor is an N-MOS transistor).

On the other hand, electrons produced from the interface of Si and $SiO_2$ of the MOS transistor when the transfer MOS transistor is turned off, that is, during the storage of charge, need to flow into the photodiode side. Therefore, the off-voltage with a high absolute value on the minus side has to be applied until the channel layer near the interface is sufficiently filled with holes.

The higher the concentration of impurities in the n-type region between the transfer MOS transistor and the photodiode, the more minus-side voltage has to be applied.

Consequently, in order to obtain better images, it has been necessary to apply to the gate electrode the voltages that differ greatly between the states where the transistor is turned on and off.

This requires application of high voltage to the gate electrode of the MOS transistor, which may break insulation of a gate insulating film or may deteriorate the characteristic of the MOS transistor.

In order to solve these problems, it is necessary to increase the thickness of the gate insulating film of the MOS transistor, and/or to increase the dimension of the MOS transistor elements, which have been obstacles in high-integration and miniaturization of CMOS area sensors.

Moreover, in the structure as described in Japanese Patent Application Laid-Open No. 2001-196572, work function of the gate electrode of the transfer MOS transistor is controlled by subjecting it to a special production step, which causes a problem of increase in production cost. In addition, when a gate electrode is additionally provided as described in Japanese Patent Application Laid-Open No. 2004-039671, the number of elements per pixel increases, causing a problem of preventing high-integration.

Thus, the present invention has been created to solve the above-described problems, and provides a photoelectric conversion device which increases the saturated number of charges in the photoelectric conversion device and efficiently reads out the charge obtained by the photoelectric conversion.

SUMMARY OF THE INVENTION

In order to solve the above-described problems, the present invention provides a photoelectric conversion device comprising a semiconductor substrate; a photoelectric conversion element comprising a first semiconductor region of a second conductive type disposed on the semiconductor substrate and a second semiconductor region of a first conductive type forming a PN junction with the first semiconductor region; and a transfer MOS transistor for transferring charge stored in the second semiconductor region, wherein the first semiconductor region has a plurality of impurity concentration peaks, an impurity concentration peak located most deeply of all the peaks in the semiconductor substrate with respect to a light-receiving surface of the photoelectric conversion element being the highest peak; and a part of the second semiconductor region is disposed under a part of a gate of the transfer MOS transistor.

Other features and advantages of the present invention will be apparent from the following description taken in conjunction with the accompanying drawings, in which like reference characters designate the same or similar parts throughout the figures thereof.

BRIEF OF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The solid state image pickup device of the present invention comprises a photoelectric conversion element comprising a first semiconductor region of a first conductive type and a second semiconductor region which can store signal charge and forms a PN junction with the first semiconductor region, and also comprises a transfer MOS transistor for transferring charge stored in the second semiconductor region. A pixel includes a combination of a photoelectric conversion element and a transfer MOS transistor as described above. The first semiconductor region has a plurality of impurity concentration peaks, wherein an impurity concentration peak located most deeply of all the peaks in the semiconductor substrate with respect to a light-receiving surface of the photoelectric conversion element is the highest peak. Further, a part of the second semiconductor region is disposed under a part of a gate of the transfer MOS transistor.

According to the above-described construction, signal charge generated by photoelectric conversion can be collected in the top surface side of the semiconductor substrate by the potential barrier due to the highest impurity concentration peak disposed most deeply in the substrate. Moreover, since a charge storage region extends under the gate of the transfer MOS transistor, the charge collected in the top surface side by the potential barrier can be efficiently stored in the charge storage region. On the other hand, if the charge storage region does not extend under the gate of the transfer MOS transistor, any charge collected in the top surface side of the semiconductor substrate may be trapped in an oxide film interface of a channel part of the transfer MOS transistor, or it may leak into a floating diffusion region to generate noise.

Therefore, according to the construction of the present invention, it is possible to efficiently read out, as signal charge, the charge collected in the top surface side of the semiconductor substrate by the potential barrier most deeply in the substrate.

Further, a part of the first semiconductor region having a plurality of impurity concentration peaks is also disposed under the transfer MOS transistor. That is, it can function as a common well of a pixel region in which a plurality of pixels is disposed.

As used herein "a semiconductor substrate" may refer to a member in a state where a material substrate has been processed to form, for example, one or more semiconductor regions or the like thereon, or a member during a series of manufacturing steps or a member which has undergone a series of manufacturing steps.

Embodiments of the present invention will now be described in detail below with reference to the drawings.

Figure 1:
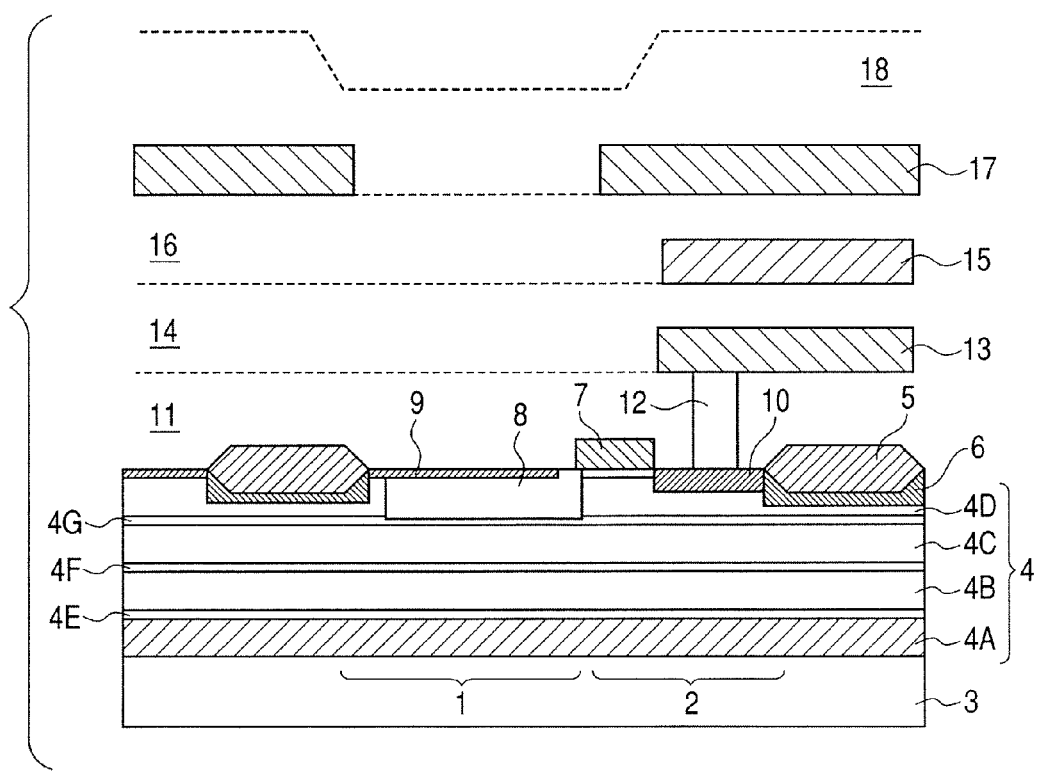
FIG. 1 is a cross-sectional view of a CMOS area sensor as an embodiment of the present invention.

FIG. 1 is a schematic cross-sectional view describing an embodiment of the present invention, which shows a photodiode unit 1 and a transfer MOS transistor unit 2 of a CMOS area sensor.

In the following embodiment, a first conductive type is defined as an N-type and a second conductive type as a P-type. However, definition is not limited to the above, but a first conductive type may be a P-type, and a second conductive type may be an N-type.

Reference numeral 3 denotes an N-type silicon substrate, and reference numeral 4 denotes a P-type well (a first semiconductor region) which has a plurality of impurity concentration peaks. Reference numeral 7 denotes a gate electrode of the transfer MOS transistor. Reference numeral 8 denotes an N-type charge storage region (a second semiconductor region) of the photodiode which can store signal charge, and reference numeral 9 denotes a surface P-type region (a third semiconductor region which is a surface charge recombination region) for providing the photodiode with a buried structure. Reference numeral 5 is a field oxide film for element isolation, and reference numeral 10 denotes an N-type high concentration region which forms floating diffusion to which charge is transferred from the N-type charge storage region.

Reference numeral 11 denotes a silicon oxide film to insulate the gate electrode and a first wiring layer; reference numeral 12 denotes a contact plug; reference numeral 13 denotes a first wiring layer; and reference numeral 14 denotes an interlayer insulating film to insulate the first wiring layer from a second wiring layer. Reference numeral 15 denotes a second wiring layer; reference numeral 16 denotes an interlayer insulating film to insulate the second wiring layer from a third wiring layer; reference numeral 17 denotes a third wiring layer; and reference numeral 18 denotes a passivation film.

In addition, a color filter layer (not shown) and a micro-lens for increasing sensitivity may be formed over the passivation film 18.

In the present embodiment, three wiring layers are formed, but the wiring layer may be one or two layers depending on the specification of a sensor to insure optical characteristics.

Figure 2:
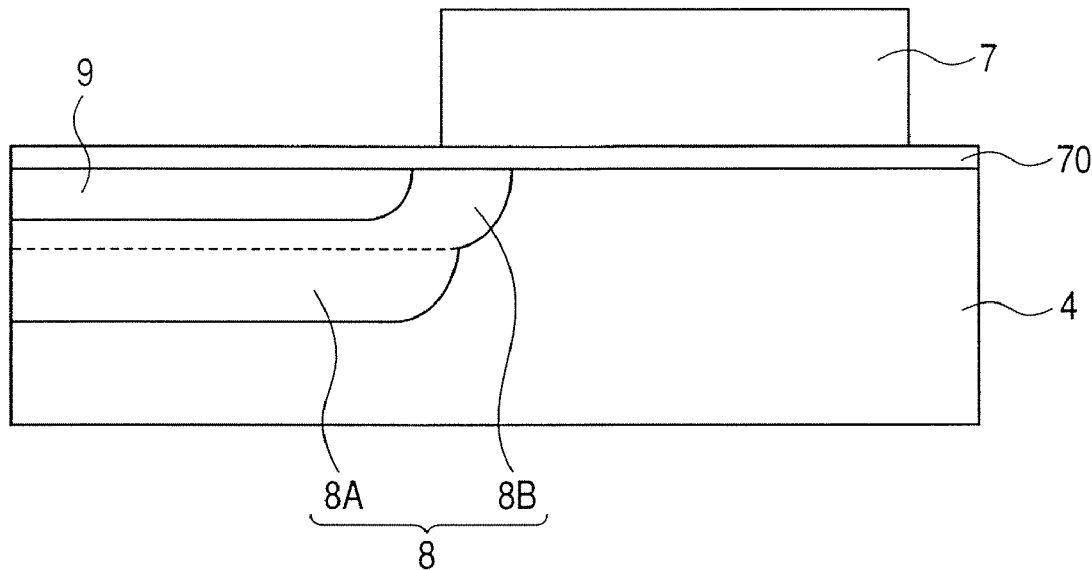
FIG. 2 is an enlarged cross-sectional view of the part of a photodiode and a transfer MOS transistor of the CMOS area sensor as an embodiment of the present invention.

FIG. 2 is an enlarged cross-sectional view of the photodiode unit and the transfer MOS transistor unit according to the present embodiment.

The N-type charge storage region 8 is formed by a plurality of (two in the present embodiment) ion implantations, each of which is represented as 8A (a fourth semiconductor region) and 8B (a fifth semiconductor region). Reference numeral 70 denotes a gate oxide film.

In the present embodiment, the gate oxide film 70 is formed with a thickness ranging from 4 to 20 nm, and the transfer MOS transistor is formed with a channel concentration, that is, a surface concentration of the P-type well 4, ranging from $1 \times 10^{15}$ to $5 \times 10^{17}$ cm$^{-3}$.

The charge storage region 8A is disposed such that it is present under the gate electrode from the photodiode-side end thereof, with a depth of 0.5 to 2 μm (This is because, in case that the depth is smaller than 0.5 μm, an adverse effect on the charge storage region 8B would undesirably be made larger. While, in case that the depth is larger than 2.0 μm, undesirably larger voltage would be necessary at the time of the charger transfer); it is present in the range of 0 to 0.4 μm from the end of the gate electrode (This is because, in case that it is present at 0 μm or more smaller form the end of the gate electrode, a transfer characteristics of the transfer MOS transistor would be degraded. While, in case that it is present at 0.4 μm or more larger, a gate length of the transfer MOS transistor would be too longer, and would be not advantageous in microminiaturizing the structure.); and it is formed with an impurity concentration ranging from $1 \times 10^{16}$ to $1 \times 10^{18}$ cm$^{-3}$ (This is because, in case that the impurity concentration is smaller than $1 \times 10^{16}$ cm$^{-3}$, a saturation charge quantity would undesirably be smaller. While, in case that the impurity concentration is larger than $1 \times 10^{18}$ cm$^{-3}$, undesirably larger voltage would be necessary for complete depletion).

The charge storage region 8B is disposed such that it is present under the gate electrode from the photodiode-side end thereof, with a depth of 0.2 to 1 μm (This is because, in case that the depth is smaller than 0.2 μm, a dark current form an interface state would undesirably be larger. While, in case that the depth is larger than 1.0 μm, an undesirable effect on the charge storage region 8A would be larger.); it is present in the range of 0.1 to 0.6 μm from the end of the gate electrode; (This is because, in case that it is present at 0.1 μm or more smaller form the end of the gate electrode, a transfer characteristics of the transfer MOS transistor would be degraded. While, in case that it is present at 0.6 μm or more larger, a gate length of the transfer MOS transistor would be too longer, and would be not advantageous in microminiaturizing the structure.) and it is formed with an impurity concentration ranging from $1 \times 10^{16}$ to $2 \times 10^{17}$ cm$^{-3}$ (This is because, in case that the impurity concentration is smaller than $1 \times 10^{16}$ cm$^{-3}$, a saturation charge quantity would undesirably be smaller. While, in case that the impurity concentration is larger than $2 \times 10^{17}$ cm$^{-3}$, an undesirably larger voltage would be necessary for complete depletion).

Moreover, when the charge storage region is formed as a single semiconductor region, it is formed with a depth of 0.2 to 2.0 μm and an impurity concentration of $1 \times 10^{16}$ to $1 \times 10^{18}$ cm$^{-3}$.

The surface P-type region 9 is disposed such that it is apart from the photodiode-side end of the gate electrode (such that it is not overlapped with the gate electrode), with a depth of 0.05 to 1 μm (This is because, in case that the depth is smaller than 0.05 μm, the dark current form the interface state would undesirably be made larger. While, in case that depth is larger than 1 μm, the undesirably larger voltage would be necessary at the time of the charge transfer.), the distance from the end of the gate electrode to the surface P-type region 9 being from 0 to 0.5 μm (wherein 0 is not included. This is because, in case that the distance is smaller than 0 μm, the transfer characteristics of the MOS transistor would be degraded. While, in case that the distance is larger than 0.5 μm, the dark current form the interface state would undesirably made larger). The surface P-type region 9 is formed with an impurity concentration ranging from $5 \times 10^{16}$ to $1 \times 10^{19}$ cm$^{-3}$ (This is because, in case that the impurity concentration is smaller than $5 \times 10^{16}$ cm$^{-3}$, the dark current form the interface state would undesirably be made larger. While, in case that the impurity concentration is larger than $1 \times 10^{19}$ cm$^{-3}$, a dark current form a residual lattice defect would undesirably be made larger).

Figure 3:
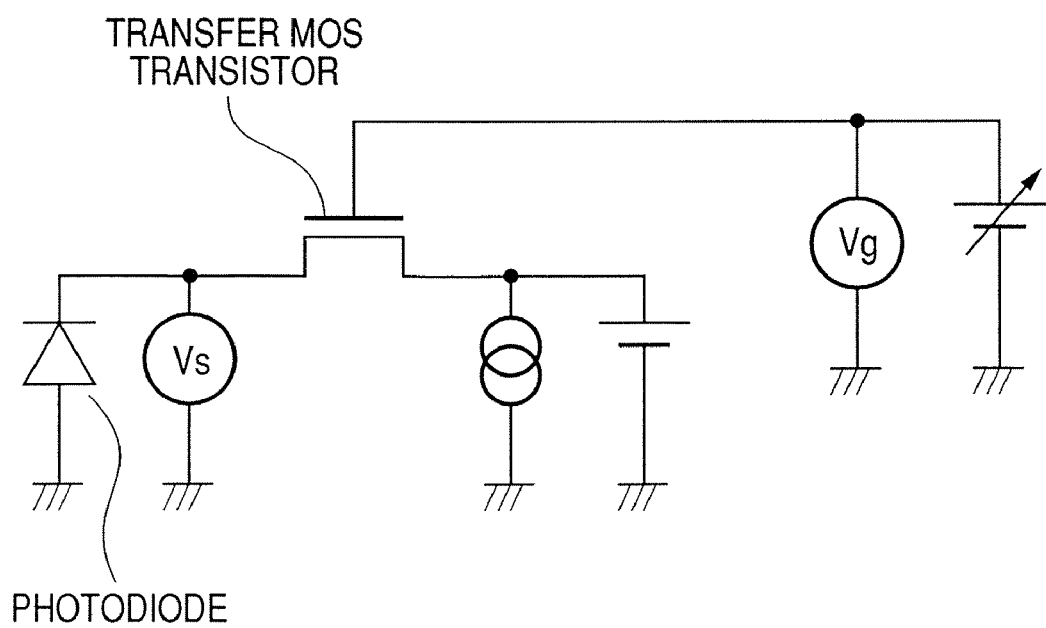
FIG. 3 is a circuit diagram of a CMOS area sensor as an embodiment of the present invention.

FIG. 3 is a circuit diagram of a CMOS sensor according to the present embodiment.

The CMOS sensor of the present embodiment illustrated as a circuit diagram is represented as a diagram like FIG. 3.

Figure 4:
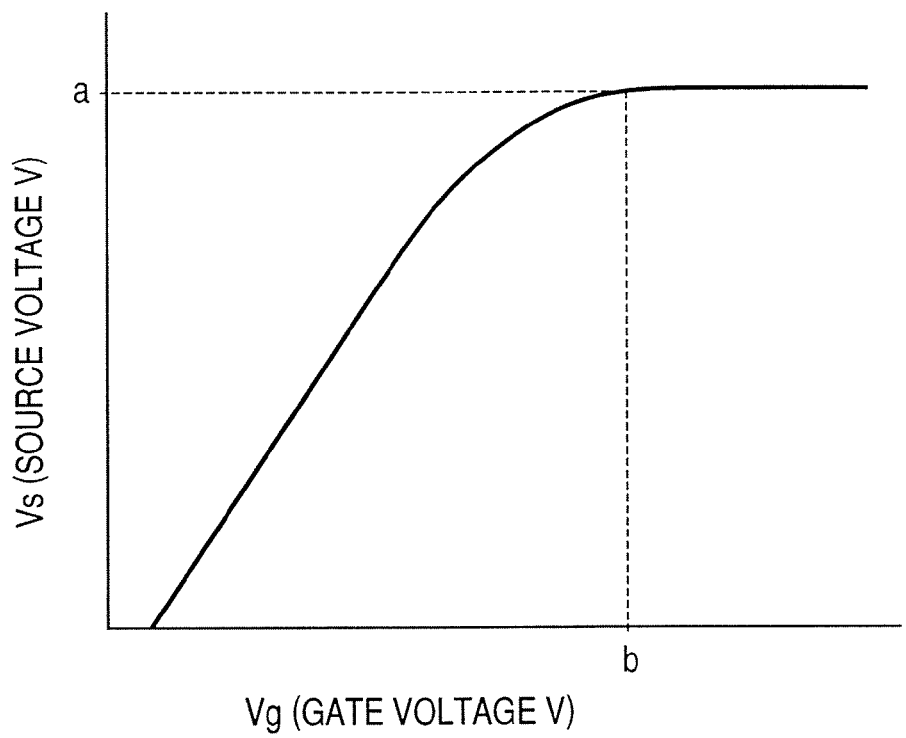
FIG. 4 is a graphical representation showing characteristics for transferring charge from a photodiode to a floating diffusion region.

FIG. 4 is a graphical representation showing charge transfer characteristics of a photodiode having a structure as described above.

The point a in FIG. 4 indicates the depletion voltage of a photodiode, which represents the voltage at which the charge storage region is substantially completely depleted. Generally, it is correlated with the saturated number of charges that can be stored in the photodiode.

The point b in FIG. 4 indicates the transferable voltage, wherein when the transferable voltage or higher voltage is applied to the gate electrode of a transfer MOS transistor, it is possible to efficiently, or even completely, transfer the charge in the photodiode to the floating diffusion region.

Figure 5:
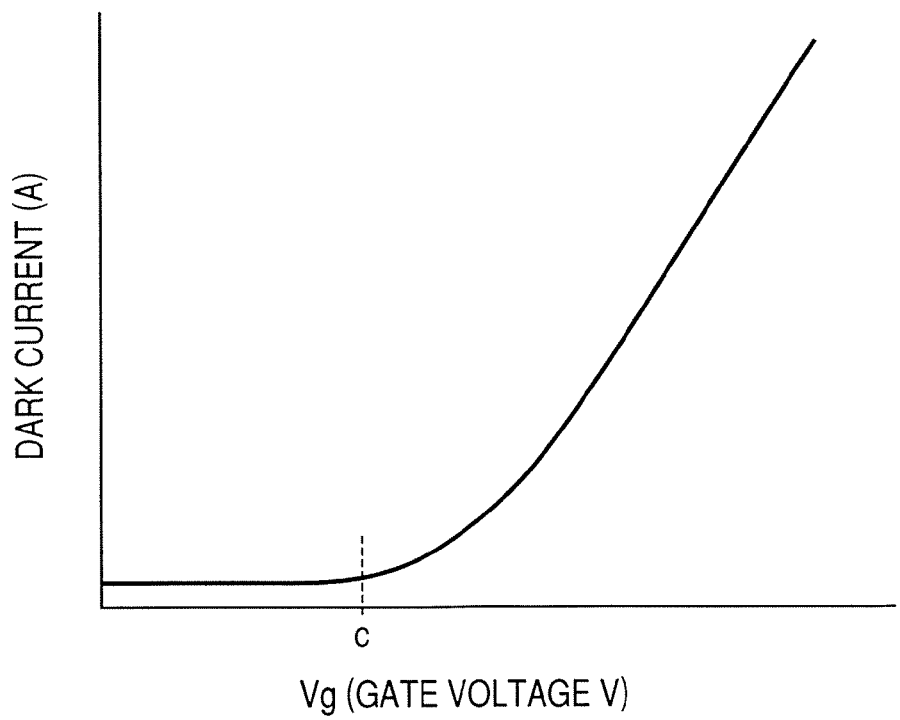
FIG. 5 is a graphical representation showing the relationship between the gate voltage when a transfer MOS transistor is turned off and dark current.

FIG. 5 is a graphical representation showing the relationship between the voltage applied to the gate electrode of the transfer MOS transistor during charge storage and dark current stored in the photodiode.

It is possible to suppress dark current generated during a storage period by applying the voltage of the point c or less to the gate electrode.

As a result of investigation by the present inventors, it has been found that, in the present embodiment, the above effect, that is, the improvement of transfer efficiency and suppression of dark current during charge storage, can be compatible with each other by setting each voltage at a value as described below, respectively, on the basis as described above.

When the transfer MOS transistor is an n-MOS, the following formulas are provided: $0<V_1<V_2/2$, $-V_2/2<V_3<0$ and $V_2/2<V_4<V_2$, wherein $V_1$ denotes a voltage for depleting the photodiode as a light-receiving unit (wherein the depletion voltage denotes a voltage as a reverse bias to be applied to the pn-junction); $V_2$ denotes a power source voltage; $V_3$ denotes a gate voltage of a transfer MOS transistor during a charge storage period; and $V_4$ denotes a gate voltage of the transfer MOS transistor during a charge transfer period.

When the transfer MOS transistor is a p-MOS, the following formulas are provided: $0<V_1<V_2/2$, $V_2/2<V_3<V_2$, $-V_2/2<V_4<0$, wherein $V_1$ denotes a depletion voltage; $V_2$ denotes a power source voltage; $V_3$ denotes a gate voltage of a transfer MOS transistor during a charge storage period; and $V_4$ denotes a gate voltage of the transfer MOS transistor during a, charge transfer period.

Figure 6A:
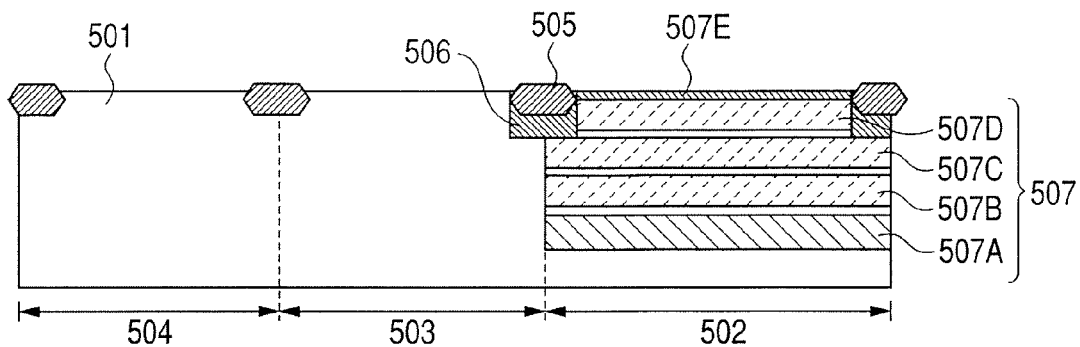
FIGS. 6A, 6B and 6C are cross-sectional views for describing the production method in embodiments of the present invention.
Figure 6B:
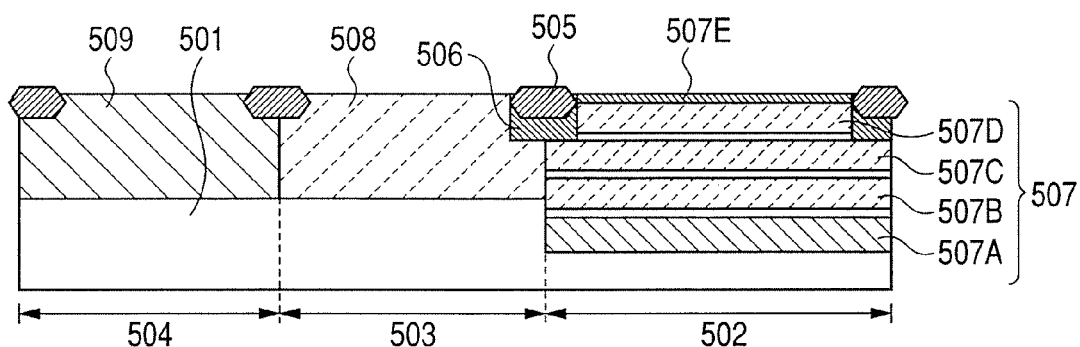
Figure 6C:
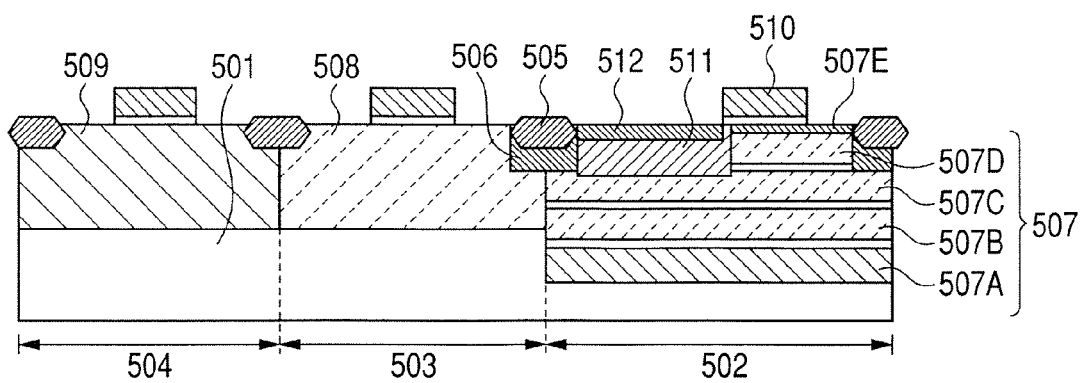

FIGS. 6A to 6C are cross-sectional views showing production steps in the present embodiment.

A well for forming pixels is formed on an n-type semiconductor substrate. A photoresist for forming a P-type well (a first semiconductor region) for forming pixels is subjected to patterning and ion implantation (FIG. 6A). At this time, the well as a pixel region is formed by ion implantation in a condition where it is comprised of a plurality of regions as described below.

The deepest well 507 A has a peak of impurity concentration of approximately $1\times10^{17}$ cm$^{-3}$, the peak being present at approximately 2.5 µm deep.

The well 507 B has a peak of impurity concentration of approximately $5\times10^{15}$ cm$^{-3}$, the peak being present at approximately 1.7 µm deep.

The well 507 C has a peak of impurity concentration of approximately $5\times10^{15}$ cm$^{-3}$, the peak being present at approximately 1.0 µm deep.

The well 507 D has a peak of impurity concentration of approximately $2\times10^{16}$ cm$^{-3}$, the peak being present at approximately 0.7 µm deep.

The well 507 E for determining channel concentration, which is located at the shallowest region, has a peak of impurity concentration of approximately $3\times10^{16}$ cm$^{-3}$, the peak being present at approximately 0.1 µm deep.

Each of the four regions, the wells 507 A to 507 D, has the function as described below.

The wells 507 B to 507 D located at a shallow part form a bridging part to introduce light carriers to photodiodes in pixels, and the well 507 A located at the deepest part forms the potential peak to determine spectral sensitivity.

Here, the deepest well 507 A has a concentration higher, preferably at least 3 times higher, more preferably at least 5 times higher, than the well 507 B, thereby forming a potential barrier between the two wells. This can introduce carriers generated by incident light in the substrate direction without loss and with efficiency, thereby capable of improving sensitivity.

Further, the saturated number of charges that can be retained in an N-type charge storage region 511 to be formed later can also be controlled by controlling the concentration and depth of the diffusion regions of the wells 507D and 507C.

Furthermore, characteristics to transfer charge from a photodiode to floating diffusion can be compatible with dark current characteristics during turning off by controlling the concentration and depth of the diffusion layer of the well 507E.

It is desirable to form a deeper well for improving sensitivity since the volume of the well that can absorb light is increased. However, increase of the number of times of ion implantation to achieve the above may deviate from the viewpoint of shortening a construction period.

Therefore, in the regions located between the respective wells 507A to 507D, the energy of ion implantation into the respective wells 507A to 507D is set so as to prevent the region of the opposite conductive type from completely depleted by the built-in potential and causing operational problems. This enables formation of wells with a minimum number of times of ion implantation.

In the present embodiment, the P-type well 507 is comprised of a plurality of regions, that is, five regions including three bridging wells 507B to 507D, a deepest well and a channel region. The upper limit of the number of bridging wells is not particularly set since the depth of the bridging well should be set according to the sensitivity required.

Moreover, the effect of sensitivity improvement can be obtained by forming at least two bridging wells.

Subsequently, a P-type well 508 and an N-type well 509, which provide regions for forming devices for circuit driving (peripheral circuit regions) are formed by using a different photomask for each well for patterning and introducing impurities (FIG. 6B).

Here, the pixel region and the peripheral circuit regions may be formed independently, or the pixel region may be shared. Further, the order to form the pixel region and the peripheral regions may be reversed.

Next, a polysilicon electrode 510 is formed by forming a gate oxide film to a thickness of 7 to 20 nm, then depositing polysilicon and patterning a photoresist into a desired shape (FIG. 6C).

Next, the N-type charge storage region 511 (a second semiconductor region) is formed by ion implantation.

At this time, the ions are implanted in the direction oblique to the normal direction of the semiconductor substrate so that the N-type region is present under the gate electrode of the transfer MOS transistor, the angle being in the range of 0 to 7 degrees.

The acceleration energy is in the range of 350 to 1,000 keV when the ionic species to be implanted is As, and is in the range of 250 to 750 keV when the ionic species to be implanted is Ph.

In the above ranges, the thickness of the polysilicon and masking material is suitably selected so that the ionic species may not penetrate the transfer MOS transistor.

Moreover, transfer characteristics can be controlled more easily by the ion implantation of As, Ph or Sb into a shallower region than the above-described diffusion layer to be implanted.

The ion-implantation into the shallower diffusion layer is preferably performed in a condition of about half the acceleration energy in the condition for forming deeper diffusion layers.

The ions are implanted in the direction that they present under the gate electrode of the transfer MOS transistor, wherein the angle is in the range of 0 to 45 degrees.

Next, a surface charge storage region (a third semiconductor region) is formed by ion implantation of B or BF$_2$.

At this time, the ions are implanted in the direction that the P-type region is away from the gate electrode (so as not to be overlapped with the gate electrode) of the transfer MOS transistor, wherein the angle is in the range of 7 to 45 degrees oblique to the normal direction of the semiconductor substrate.

More specific conditions in the above-described embodiment are set, for example, as follows: when the gate oxide film has a thickness of 15 nm; the gate electrode has a thickness of 300 nm; and the channel has a concentration of $3\times10^{16}$ cm$^{-3}$, the conditions for forming the P-type region include an ionic species of B and an acceleration energy of 15 keV. Good compatibility of transfer characteristics with dark current characteristics can be achieved by the manufacture in which implantation amount is from $5\times10^{13}$ to $1\times10^{14}$ cm$^{-3}$ and the implant angle is in the range of 20 to 30 degrees in the direction away from the gate electrode of the transfer MOS transistor.

In accordance with the present embodiment, the depletion voltage (voltage a) in FIG. 4 can be controlled in the range from 0.9 to 1.6 V; the transferable voltage (voltage b) in FIG. 4 can be controlled in the range from 2.5 to 3.5 V; and the dark current suppression voltage (voltage c) in FIG. 5 can be controlled in the range of −1.5 to −0.5 V. Thus, the transfer characteristics and the suppression of dark current are compatible.

Although the present embodiment has described a structure in which electrons are stored in a photodiode, a structure in which holes are stored has the same effect. The latter structure can be formed by reversing all of P-type layers and N-type layers.

Moreover, although the present embodiment has described a CMOS area sensor, it has the same effect when it is applied to CCD. In the latter case, the floating diffusion region 10 is replaced with VCCD.

Contact-opening and subsequent steps in the present manufacturing method will be omitted since they are the same as those for manufacturing a conventional CMOS area sensor.

A plurality of well layers have been provided in the photodiode unit such that the deepest well layer has the concentration that is higher than that of the well layers located above the same. By this structure, the light carriers absorbed in the well layers can be introduced to the photodiode without loss and with efficiency in the direction of the substrate, resulting in improvement in sensitivity.

Next, an image pickup system using the photoelectric conversion device of the above-described embodiment will be described.

An example of a case where a photoelectric conversion device of the present invention is applied to a still camera will be described in detail with reference to FIG. 7.

Figure 7:
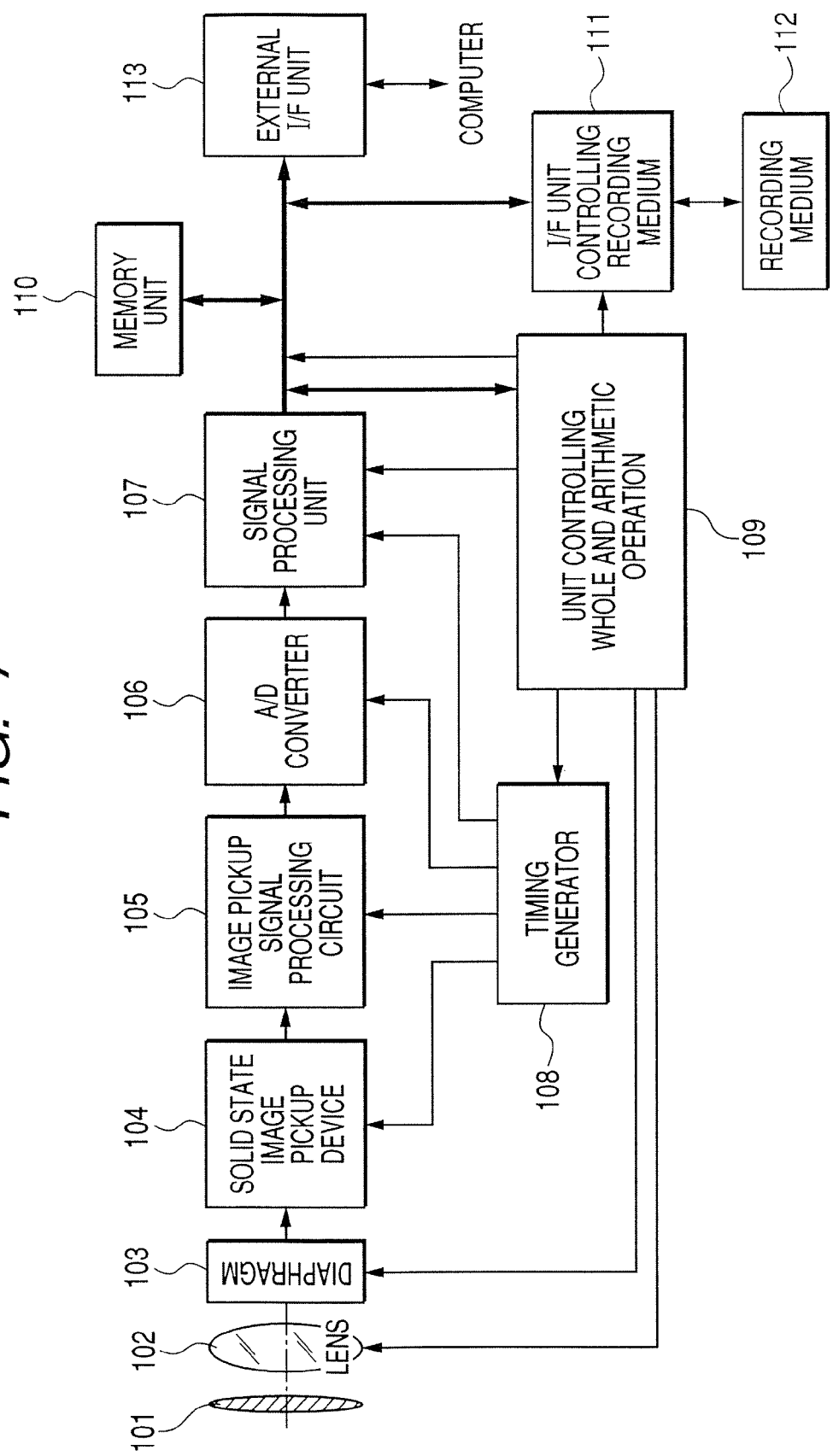
FIG. 7 is a block diagram showing a case where a photoelectric conversion device as an embodiment of the present invention is applied to a still video camera.
Figure 8:
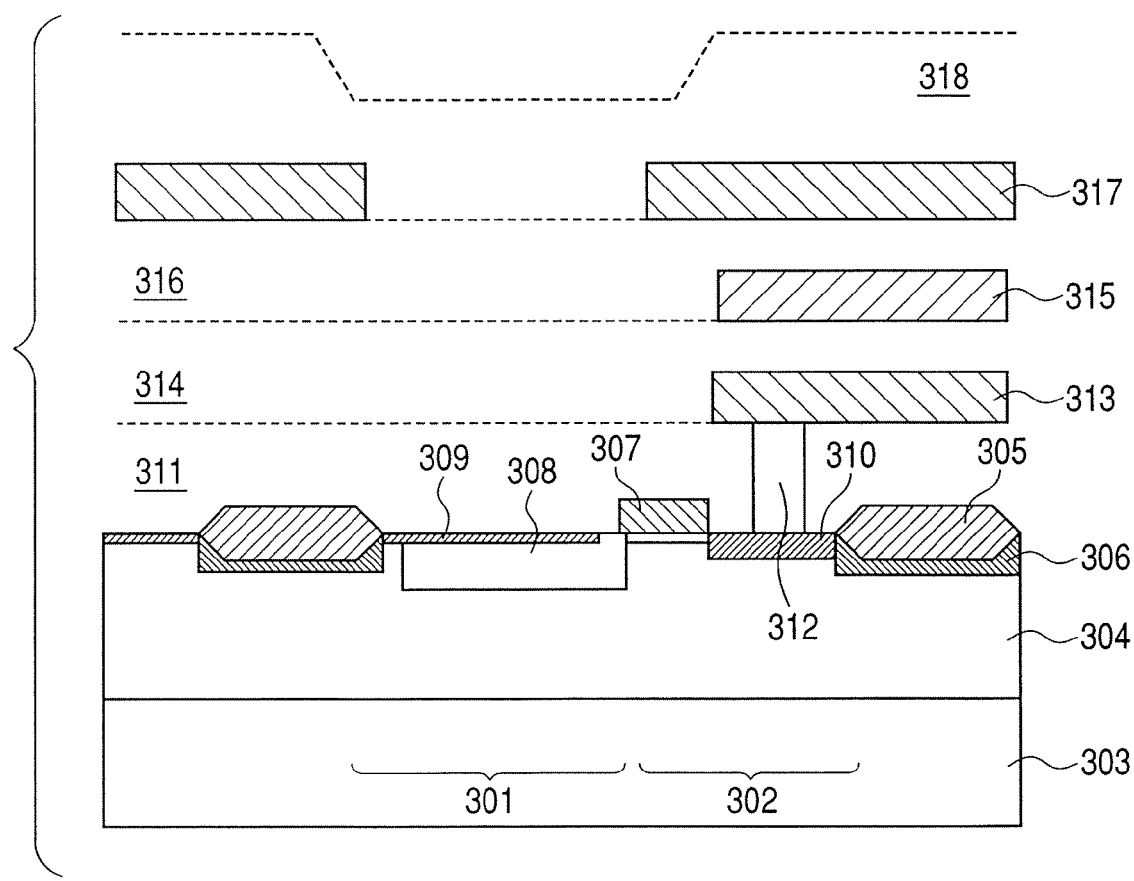
FIG. 8 is a cross-sectional view of a conventional CMOS area sensor.

FIG. 7 is a block diagram showing a case where a photoelectric conversion device of the present invention is applied to "a still video camera". The photoelectric conversion device of the above-described embodiment is described as a solid state image pickup element 104.

In FIG. 7, reference numeral 101 denotes a barrier combining lens protection and a main switch; reference numeral 102 denotes a lens for forming an optical image of a subject on a solid state image pickup element 104; reference numeral 103 denotes a diaphragm for varying the quantity of light that passed through the lens 102; reference numeral 104 denotes a solid state image pickup element for capturing the subject formed on the lens 102 as an image signal; reference numeral 106 denotes an A/D converter which performs analog-digital conversion of the image signal output from the solid state image pickup element 104; reference numeral 107 denotes a signal processing unit in which image data output from the A/D converter 106 are subjected to various corrections and/or are compressed; reference numeral 108 denotes a timing generator which outputs various timing signals to the solid state image pickup element 104, an image pickup signal processing circuit 105, the A/D converter 106 and the signal processing unit 107; reference numeral 109 denotes a unit controlling whole and arithmetic operation which controls various arithmetic operations and the whole of the still video camera; reference numeral 110 denotes a memory unit for temporarily storing the image data; reference numeral 111 denotes an I/F unit for recording on a recording medium or reading out therefrom; reference numeral 112 denotes a removable recording medium such as a semiconductor memory for recording or reading out the image data; and reference numeral 113 denotes an I/F unit for communicating with an external computer and the like.

Next, the operation of the still video camera during photographing with a construction as mentioned above will be described.

When the barrier 101 is opened, the main power source is turned on. Next, the power source for the control system is turned on, and then the power source for the circuit of the image pickup system such as the A/D converter 106 is turned on.

After this, the unit controlling whole and arithmetic operation 109 opens the diaphragm 103 in order to control the light exposure, and the signal output from the solid state image pickup element 104 is converted in the A/D converter 106 and then input into the signal processing unit 107. The unit controlling whole and arithmetic operation 109 performs the operation of exposure on the basis of the data.

Brightness is judged by the result of photometric measurements, and the unit controlling whole and arithmetic operation 109 controls the diaphragm according to the result.

Next, a high frequency component is taken out, and the unit controlling whole and arithmetic operation 109 performs operation of the distance to the subject, on the basis of the signal output from the solid state image pickup element 104.

After this, the lens is driven to judge whether focus is achieved or not, and when it is judged that focus is not achieved, the lens is driven again to measure distances.

Then, final exposure starts after focusing is confirmed. When the exposure is completed, the image signal output from the solid state image pickup element 104 is A-D converted in the A/D converter 106, passes through the signal processing unit 107 and is written in the memory unit by the unit controlling whole and arithmetic operation 109.

After this, the data stored in the memory unit 110 passes through the I/F unit controlling recording medium and is recorded on the removable recording medium 112 such as a semiconductor memory by the control of the unit controlling whole and arithmetic operation 109. The data stored in the memory unit 110 may also pass through the external I/F unit 113 to be directly input into a computer or the like for performing image processing.

This application claims priority from Japanese Patent Application No. 2004-254359 filed Sep. 1, 2004, which is hereby incorporated by reference herein.

What is claimed is:

1. A photoelectric conversion apparatus comprising:
a semiconductor substrate of a first conductivity type;
a first impurity region of a second conductivity type opposite to the first conductivity type;
a photoelectric conversion element including a second impurity region of the first conductivity type formed within the first impurity region, and a third impurity region of the second conductivity type formed on and adjacent to the second impurity region; and
a transfer MOS transistor for transferring an electric charge accumulated in the second impurity region,
wherein the first impurity region includes a surface region in which a channel of the transfer MOS transistor is formed, a first region formed under the surface region, a second region formed under the first region, and a third region formed under the second region, such that a peak impurity concentration $C_0$ of the surface region, a peak impurity concentration $C_1$ of the first region, a peak impurity concentration $C_2$ of the second region, and a peak impurity concentration $C_3$ of the third region meet a relation: $C_2<C_1<C_0<C_3$, and wherein the second impurity region includes a fourth region and a fifth region such that a part of at least one of the fourth and fifth regions is arranged under the transfer MOS transistor.

2. The photoelectric conversion apparatus according to claim 1, wherein the surface region has an impurity concentration of $1\times10^{15}$-$5\times10^{17}$ cm$^{-3}$, the second impurity region has an impurity concentration of $1\times10^{16}$-$3\times10^{18}$ cm$^{-3}$ and is arranged at a depth of 0.2-2.0 μm, within a range from 0-0.6 μm under a lower edge of a gate electrode of the transfer MOS transistor, and the third impurity region has an impurity concentration of $5\times10^{16}$-$1\times10^{19}$ cm$^{-3}$ and is arranged at a depth of 0.05-1.0 μm, within a range from a distance larger than 0 and not larger than 0.5 μm under a lower edge of the gate electrode of the transfer MOS transistor.

3. The photoelectric conversion apparatus according to claim 1 or 2, wherein the fourth region has an impurity concentration of $1\times10^{16}$-$1\times10^{18}$ cm$^{-3}$ and is arranged at a depth of 0.5-2.0 μm, within a range from 0-0.4 μm under a lower edge of a gate electrode of the transfer MOS transistor, and the fifth region has an impurity concentration $1\times10^{16}$-$2\times10^{17}$ cm$^{-3}$ and is arranged at a depth of 0.5-2.0 μm, within a range from 0.1-0.6 μm under a lower edge of a gate electrode of the transfer MOS transistor.

4. The photoelectric conversion apparatus according to claim 1, wherein the photoelectric conversion apparatus is incorporated in an imaging system that includes:

an optical system for focusing a light onto the photoelectric conversion apparatus; and a signal processing circuit for processing an output signal from the photoelectric conversion apparatus.

* * * * *